(12) United States Patent
Ko et al.

(10) Patent No.: US 9,245,877 B2
(45) Date of Patent: Jan. 26, 2016

(54) LED DEVICE AND LED LAMP USING THE SAME

(71) Applicant: Lextar Electronics Corporation, Hsinchu (TW)

(72) Inventors: Bo-Yu Ko, New Taipei (TW); Yee-Cheng Chang, Kaohsiung (TW); Chun-Wei Wang, New Taipei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/305,071

(22) Filed: Jun. 16, 2014

(65) Prior Publication Data
US 2015/0207049 A1    Jul. 23, 2015

(30) Foreign Application Priority Data

Jan. 20, 2014  (TW) .............................. 103101994 A

(51) Int. Cl.
*H01L 33/62*  (2010.01)
*H01L 25/16*  (2006.01)

(52) U.S. Cl.
CPC ..... *H01L 25/167* (2013.01); *H01L 2224/32245* (2013.01); *H01L 2224/45144* (2013.01); *H01L 2224/48091* (2013.01); *H01L 2224/48247* (2013.01); *H01L 2224/48257* (2013.01); *H01L 2224/48465* (2013.01); *H01L 2224/73265* (2013.01)

(58) Field of Classification Search
CPC ... H01L 33/48; H01L 33/00; H01L 29/66106; H01L 29/7808; H01L 29/866; H01L 33/38; H01L 33/502; H01L 33/52; H01L 33/62

USPC ............................................. 257/79, 199, 481
See application file for complete search history.

(56) References Cited

U.S. PATENT DOCUMENTS

| | | | |
|---|---|---|---|
| 7,714,336 B2 * | 5/2010 | Imai .............................. | 257/88 |
| 7,956,378 B2 * | 6/2011 | Son ................................. | 257/99 |
| 2007/0194422 A1 * | 8/2007 | Lai et al. ............... | H01L 25/167 |
| | | | 257/684 |
| 2012/0112237 A1 | 5/2012 | Zheng et al. | |
| 2014/0306245 A1 * | 10/2014 | Hayashi et al. ......... | H01L 33/62 |
| | | | 257/88 |

FOREIGN PATENT DOCUMENTS

WO     2012058834 A1    5/2012

* cited by examiner

*Primary Examiner* — Daniel Whalen
*Assistant Examiner* — Suberr Chi
(74) *Attorney, Agent, or Firm* — McClure, Qualey & Rodack, LLP

(57) ABSTRACT

A LED device is provided. The LED comprises a frame, a housing, a LED chip and a protection component. The frame comprises a first lead frame and a second lead frame disposed along a first direction and isolated from each other. The housing partially covers the first and second lead frames, and has a receiving portion exposing parts of the surfaces of the first and second lead frames. The LED chip is disposed in the receiving portion on the exposed surface of the first lead frame, and electrically connected to the first and second lead frames. The protection component is disposed on a surface of the second lead frame that is covered by the housing and electrically connected to the first lead frame. None of the sides of a vertical projection of the protection component on the second lead frame is parallel or perpendicular to the first direction.

10 Claims, 3 Drawing Sheets

LED DEVICE AND LED LAMP USING THE SAME

This application claims the benefit of Taiwan application Serial No. 103101994, filed on Jan. 20, 2014, the subject matter of which is incorporated herein by reference.

BACKGROUND

1. Technical Field

The invention relates in general to a light emitting diode (LED) device and a LED lamp using the same. More particularly, the invention relates to a LED device comprising a protection component disposed in a way that none of the sides thereof is parallel or perpendicular to an extending direction of the lead frame of the LED device, as well as a LED lamp using the same.

2. Description of the Related Art

In general, a light emitting diode (LED) may comprise a protection component. The protection component and the LED chip are connected in parallel so as to provide a current vent path when a reverse surge occurs.

If the protection component is disposed in the receiving portion of a LED device as the LED chip, the protection component may absorb a part of the light and deteriorate the luminous efficiency of the LED device. One approach for resolving this problem is embedding the protection component in the housing. With such disposition, the light emitted from the LED chip will not reach the protection component, so that the protection component will not absorb the light and deteriorate the luminous efficiency of the LED device. In the manufacturing process of such a LED device, the protection component is typically disposed on a frame, the housing embedding the protection component then is formed by way of plastic injection or the like.

In a conventional LED device, the protection component is disposed with a side parallel to a side of the frame. However, with such arrangement, the plastic material ejected at a high speed and high temperature may collide with the protection component and damage the conductive adhesive bonding the protection component on the frame, and further make the protection component fail. In addition, since the flow of the plastic material is resisted by the protection component, the yield rate of modeling LED device products will decrease.

SUMMARY

The invention is directed to a light emitting diode (LED) device and a LED lamp using the same. In the LED device, none of the sides of the protection component is parallel or perpendicular to an extending direction of the lead frame, so that failure of the protection component and decrease in the yield rate of modeling can be avoided.

According to some embodiment of the present invention, a LED device comprising a frame, a housing, a LED chip and a protection component is provided. The frame comprises a first lead frame and a second lead frame which are disposed along a first direction and isolated from each other. The housing partially covers the first and second lead frames, and has a receiving portion exposing parts of the surfaces of the first and second lead frames. The LED chip is disposed in the receiving portion on the exposed surface of the first lead frame and electrically connected to the first and second lead frames. The protection component is disposed on a surface of the second lead frame that is covered by the housing and electrically connected to the first lead frame. None of the sides of a vertical projection of the protection component on the second lead frame is parallel or perpendicular to the first direction.

According to some embodiment of the present invention, a LED lamp comprising a substrate, a said LED device and a driving circuit is provided. The LED device is disposed on the substrate. The driving circuit is electrically connected to the LED device for controlling the ON/OFF state of the LED device.

Figure 1A:
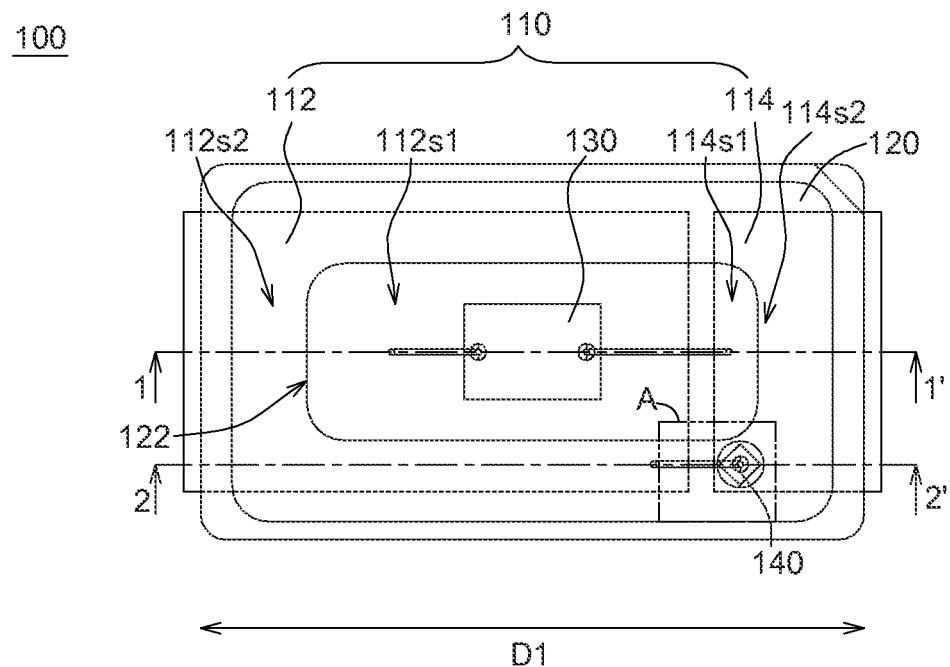
FIGS. 1A-1D schematically show a LED device according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1B:
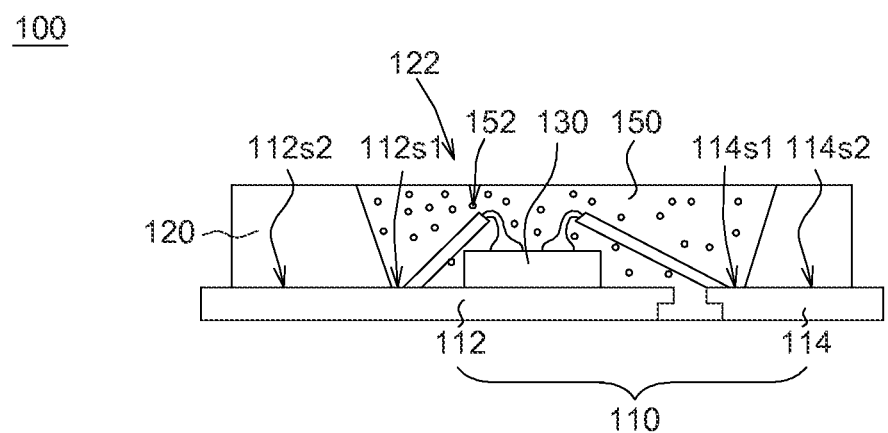
Figure 1C:
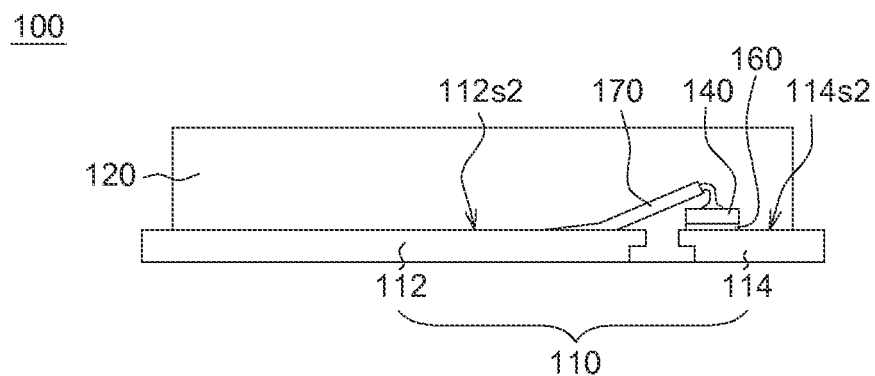
Figure 1D:
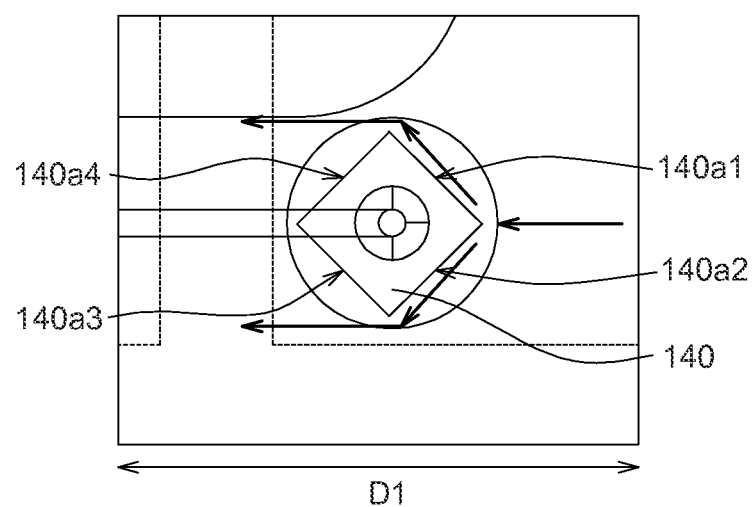

FIGS. 1A-1D schematically show a LED device 100 according to one embodiment of the invention. For the purpose of simplicity and clarity, parts of the elements and reference numerals may be omitted in some diagrams. FIG. 1A is a top view of the LED device 100. FIG. 1B is a cross-sectional view of the LED device 100 along a cross-sectional line 1-1' in FIG. 1A. FIG. 1C is a cross-sectional view of the LED device 100 along a cross-sectional line 2-2' in FIG. 1A. FIG. 1D is an enlarged diagram of an area A of the LED device 100 of FIG. 1A. The LED device 100 comprises a frame 110, a housing 120, a LED chip 130 and a protection component 140.

As shown in FIG. 1A, the frame 110 comprises a first lead frame 112 and a second lead frame 114 which are disposed along a first direction D1 and isolated from each other. The first direction D1 is also the extending direction of the frame 110. Here, the term "isolated" refers to not only the separation in space but also the insulation in electricity.

The housing 120 partially covers the first lead frame 112 and the second lead frame 114. As such, the first lead frame 112 has an exposed surface $112s1$ and a covered surface $112s2$, and the second lead frame 114 has an exposed surface $114s1$ and a covered surface $114s2$. The housing 120 has a receiving portion 122 exposing parts of the exposed surfaces $112s1$ and $114s1$ of the first lead frame 112 and second lead frame 114. In some embodiments, an inner surface of the receiving portion 122 can be reflective, and the housing 120 can be used as a reflector cup for reflecting the light emitted from the LED chip 130. The housing 120 may be formed from a thermosetting or thermoplastic material.

As shown in FIG. 1B, the LED chip 130 is disposed in the receiving portion 122 on the exposed surface $112s1$ of the first lead frame 112 and electrically connected to the first lead frame 112 and the second lead frame 114. In some embodiments, the LED chip 130 is a blue light LED chip, but the invention is not limited thereto.

As shown in FIG. 1C, the protection component 140 is disposed on the surface $114s2$ of the second lead frame 114 that is covered by the housing 120, and electrically connected to the first lead frame 112. In some embodiments, as shown in FIG. 1C, the protection component 140 is fixed on the second lead frame 114 by using a conductive adhesive 160, and connected to the first lead frame 112 by way of wire bonding. In some embodiments, the wire 170 connecting the protection component 140 to the first lead frame 112 may be a gold wire. The protection component 140 and the LED chip 130 may be connected inverse-parallelly. In some embodiments, the protection component 140 may be a voltage stabilizer such as a Zener diode.

As shown in FIGS. 1A and 1D, none of the sides 140a1-140a4 (illustrated in FIG. 1D) of a vertical projection of the protection component 140 on the second lead frame 114 is parallel or perpendicular to the first direction D1. With such disposition, when the plastic material used for forming the housing 120 is ejected along a first direction D1, the high-speed and high-temperature plastic material will bypass the protection component 140 in arrow directions indicated in FIG. 1D. As such, the plastic material can bypass the protection component 140 without facing too much resistance. The yield rate of modeling the LED device 100 can thus be increased. Furthermore, the conductive adhesive 160 is less likely damaged by the impact of the plastic material, so that the protection component 140 disposed on the frame 110 will not fail in subsequent processes of manufacturing the LED device 100. In some embodiments, as shown in FIGS. 1A and 1D, an angle of 45° or 135° is formed between the first direction D1 and any sides 140a1-140a4 of the vertical projection of the protection component 140 on the second lead frame 114, but the invention is not limited thereto.

In some embodiments, the LED device 100 may further comprise an encapsulant 150. As shown in FIG. 1B, the encapsulant 150 is filled into the receiving portion 122 and encapsulate the LED chip 130. Like the housing 120, the encapsulant 150 may be formed from a thermosetting or thermoplastic material. In some embodiments, the encapsulant 150 may further comprise a plurality of wavelength converters 152 capable of absorbing a part of a first light emitted from the LED chip 130 and converting the absorbed first light into a second light with a longer wavelength, and the first light and the second light are mixed to form a third light. For example, the LED chip 130 may be a blue light LED chip, and the wavelength converters 152 may be fluorescent powders capable of absorbing a blue light and releasing a visible light with a wavelength longer than that of the blue light, and the third light is a white light.

Figure 2:
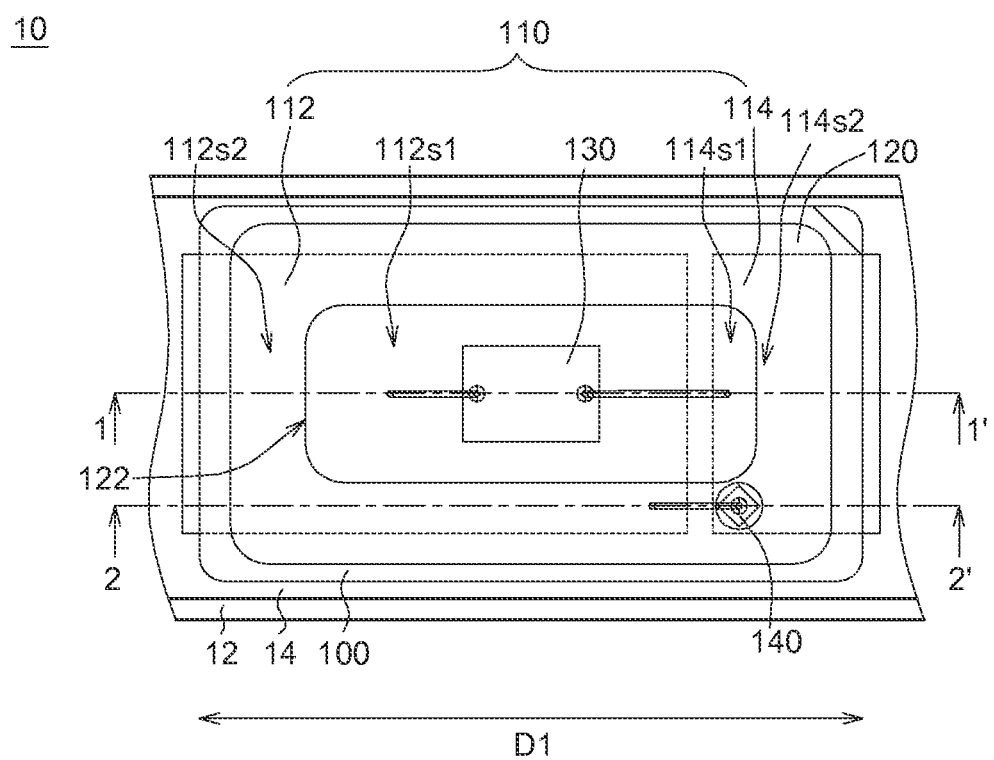
FIG. 2 schematically shows a LED lamp according to one embodiment of the invention.

FIG. 2 schematically shows a LED lamp 10 according to one embodiment of the invention. The LED lamp 10 comprises a substrate 12, a LED device 100 as shown in FIGS. 1A-1D, and a driving circuit 14. The LED device 100 is disposed on the substrate 12. The driving circuit 14 is electrically connected to the LED device 100 for controlling the ON/OFF state of the LED device 100. Although the LED lamp 10 of the present embodiment exemplarily comprises a LED device 100, the LED lamp 10 is not limited thereto. The LED lamp 10 may comprise other LED devices. In some embodiments, when a plurality of LED devices according to embodiments of the invention are disposed on the substrate 12, the driving circuit 14 can be used for driving one or a plurality of LED devices.

According to the LED device and the LED lamp using the same disclosed in embodiments of the invention, the protection component is disposed in a way that none of the sides thereof is parallel or perpendicular to an extending direction of the lead frame. As such, failure of the protection component and deterioration in the yield rate of modeling can be avoided.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light emitting diode (LED) device, comprising:
    a frame comprising a first lead frame and a second lead frame which are disposed along a first direction and isolated from each other, wherein the first direction is substantially parallel to an edge of the second lead frame;
    a housing partially covering the first and second lead frames and having a receiving portion exposing parts of surfaces of the first and second lead frames;
    a LED chip disposed in the receiving portion on the exposed surface of the first lead frame and electrically connected to the first and second lead frames; and
    a protection component disposed on a surface of the second lead frame, wherein the protection component is covered by the housing and electrically connected to the first lead frame, and none of the sides of a vertical projection of the protection component on the second lead frame is parallel or perpendicular to the first direction.

2. The LED device according to claim 1, wherein an angle of 45° or 135° is formed between the first direction and any sides of the vertical projection of the protection component on the second lead frame.

3. The LED device according to claim 1, wherein the protection component is a Zener diode.

4. The LED device according to claim 1, wherein the LED chip and the protection component are connected inverse-parallelly.

5. The LED device according to claim 4, wherein the protection component is fixed on the second lead frame by using a conductive adhesive and connected to the first lead frame by way of wire bonding.

6. The LED device according to claim 1, further comprising an encapsulant filled into the receiving portion, the encapsulant encapsulating the LED chip.

7. The LED device according to claim 6, wherein the housing and the encapsulant are formed from a thermosetting or thermoplastic material.

8. The LED device according to claim 7, wherein the encapsulant further comprises a plurality of wavelength converters capable of absorbing a part of a first light emitted from the LED chip and converting the absorbed first light into a second light with a longer wavelength, and the first light and the second light are mixed to form a third light.

9. The LED device according to claim 8, wherein the LED chip is a blue light LED chip, the wavelength converters are fluorescent powders capable of absorbing a blue light and releasing a visible light with a wavelength longer than that of the blue light, and the third light is a white light.

10. A light emitting diode (LED) lamp, comprising:
    a substrate;
    a LED device according to claim 1 disposed on the substrate; and
    a driving circuit electrically connected to the LED device for controlling the ON/OFF state of the LED device.

* * * * *